US007446627B2

(12) United States Patent
Hacker et al.

(10) Patent No.: US 7,446,627 B2
(45) Date of Patent: Nov. 4, 2008

(54) COMPACT STABILIZED FULL-BAND POWER AMPLIFIER ARRANGEMENT

(76) Inventors: Jonathan Bruce Hacker, 3522 Sweet Clover St., Thousand Oaks, CA (US) 91382; Moonil Kim, # 4-807, Dongsung-Apt, Shinnae-dong, Jungrang-ku, Seoul (KR)

( * ) Notice: Subject to any disclaimer, the term of this patent is extended or adjusted under 35 U.S.C. 154(b) by 3 days.

(21) Appl. No.: 11/395,826

(22) Filed: Mar. 31, 2006

(65) Prior Publication Data

US 2007/0229186 A1 Oct. 4, 2007

(51) Int. Cl.
*H03H 7/38* (2006.01)
*H01P 5/12* (2006.01)
*H03F 3/60* (2006.01)
*H03F 3/68* (2006.01)

(52) U.S. Cl. ......................... 333/125; 333/34; 333/136; 333/137; 330/286; 330/296

(58) Field of Classification Search ................... 333/34, 333/125, 136, 137; 330/286, 295
See application file for complete search history.

(56) References Cited

U.S. PATENT DOCUMENTS 4,272,740 A * 6/1981 MacMaster et al. ......... 333/127
4,539,528 A * 9/1985 Bayraktaroglu et al. ..... 330/287
4,651,115 A * 3/1987 Wu ............................ 333/26
5,262,739 A * 11/1993 Dalman ....................... 333/26
5,724,011 A * 3/1998 McWhirter et al. .......... 333/157
5,736,908 A 4/1998 Alexanian et al.
6,097,265 A * 8/2000 Chan et al. .................... 333/26

OTHER PUBLICATIONS

Collin, Robert E., Foundations for Microwave Engineering, 1992, pp. 205-210 and 442-450, McGraw-Hill, Inc., New York, NY.
Maloratsky, Leo G., Reviewing the Basics of Microstrip Lines, Microwaves & RF, Mar. 2000, pp. 79, 80, 82, 84, 86, and 88.

* cited by examiner

*Primary Examiner*—Robert J. Pascal
*Assistant Examiner*—Kimberly E Glenn
(74) *Attorney, Agent, or Firm*—Eugene S. Indyk

(57) ABSTRACT

High frequency power amplification modules comprise a dielectric substrate supporting a stepped impedance transition coupled to the input of a power amplifier and a symmetrically disposed stepped impedance transition connected to the output of the power amplifier. The power amplification modules are oriented in an electromagnetic energy field so that input electromagnetic energy is coupled to the input of the power amplifier by the input side stepped impedance transition, amplified by the amplifier, and emitted from the module by the output side stepped impedance transition. A plurality of the power amplification modules may be organized into an array to provide a power combiner. The power amplification modules in the array may be linked by isolation impedances that decouple the modules in the array.

6 Claims, 4 Drawing Sheets

COMPACT STABILIZED FULL-BAND POWER AMPLIFIER ARRANGEMENT

TECHNICAL FIELD

This disclosure relates to high frequency power amplifiers, especially radio frequency, microwave, and millimeter wave power amplifiers and the like.

BACKGROUND

High frequency power amplifiers are crucial elements in a variety of radio frequency circuit applications and are challenging analog circuits to design. In traditional monolithic microwave integrated circuit (MMIC) implementations of power amplifiers, the outputs of many small power transistors are combined using corporate power combining techniques. These techniques are lossy, narrow band, and waste die area on an MMIC. Power combining using spatial techniques is an emerging technological approach that seeks to overcome these limitations. One promising approach is the use of MMIC's attached to tapered slot antenna cards stacked in waveguide. See U.S. Pat. No. 5,736,908. Significant amounts of high frequency power can be generated using this approach, but the circuitry is unstable and the antennas are too large. Accordingly, there is a need for a stable wide band power amplifier of reasonable size that can be used to produce significant amounts of microwave and millimeter wave power.

SUMMARY

The need specified above is met by new power amplifier modules or cards that contain integral stabilization and compact broadband antennas which couple a power amplifier to an electromagnetic energy field. These cards can be used in power combining arrays in electromagnetic energy fields such as those found in free space or confined by waveguides. More specifically, the power amplifier cards use resistive stabilizers between cards that damp oscillations that plague prior amplifiers. They also use compact step impedance transitions as antennas that allow the power amplifier to cover the full waveguide band in a much smaller structure than the tapered slot approach referred to in the '908 patent mentioned above. This reduces the size and cost of the power amplifier.

DETAILED DESCRIPTION

Figure 1:
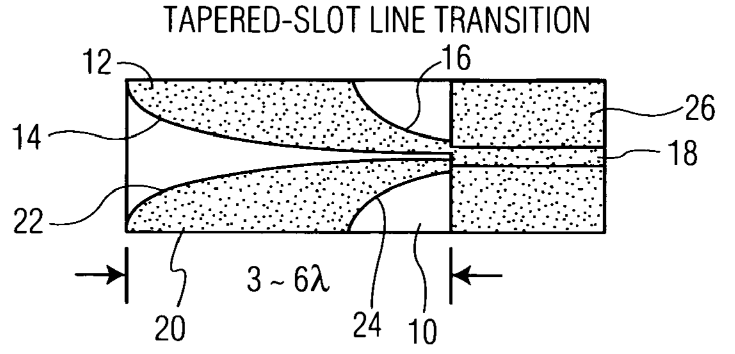
FIG. 1 is an illustration of a smoothly tapered slot line impedance transition used in prior amplifier arrays.

FIG. 1 shows a tapered-slot line transition structure used to couple an electromagnetic energy field to the input of a RF power amplifier. The RF amplifier then emits an amplified version of the input field through a structure similar to the structure shown in FIG. 1. The transition of FIG. 1 comprises a thin rectangular dielectric substrate 10. The top side of the substrate 10 has a layer of metallization comprising a tapered section 12 having two curved edges 14 and 16 that define a gradually narrowing conductive area on the substrate 10. The narrow end of the tapered section 12 is connected to a narrow width micro-strip line 18 that may be connected to the input or output of an RF power amplifier not shown in FIG. 1. The bottom side of the substrate 10 is coated with another metallization layer comprising a tapered section 20 symmetrically disposed with respect to the tapered section 12 as shown in FIG. 1. The tapered section 20 has curved edges 22 and 24 that define a gradually narrowing conductive area on the bottom of the substrate 10. The narrow end of the tapered section 20 is connected to a ground plane 26 on the bottom of the substrate 10. The transition structure of FIG. 1 is used to couple electromagnetic energy to the input of an RF power amplifier; it is also used to radiate output electromagnetic energy from the output of an RF power amplifier. Arrays of RF power amplifiers each associated with transition structures on their respective inputs and outputs may be assembled to create as a power combiner.

Figure 2:
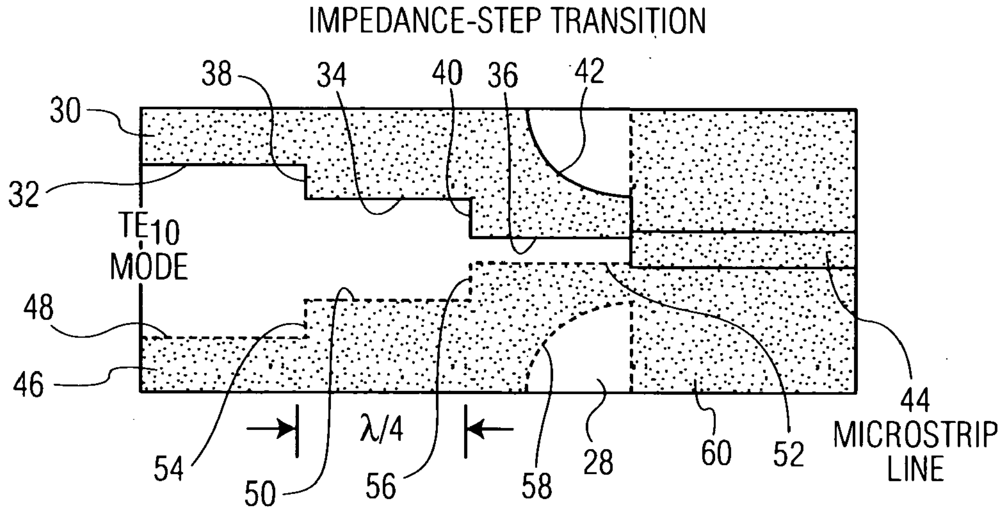
FIG. 2 is an illustration of a new stepped impedance transition in accordance with this invention.
Figure 4:
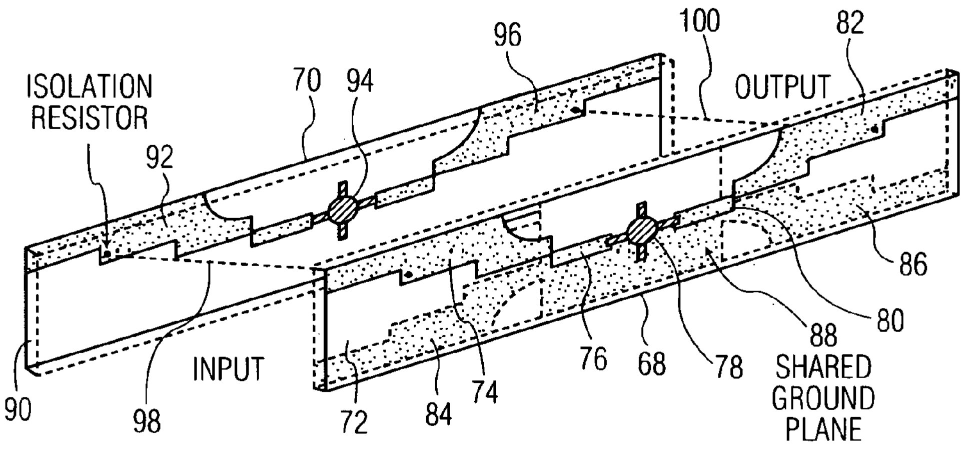
FIG. 4 is an illustration of a power combining array in accordance with the invention.

The problem with transition structures such as the one shown in FIG. 1 is that they need to be too large. As shown in FIG. 1, they need to be on the order of 3 to 6 times the operational wavelength of the power amplifier. This problem can be solved in accordance with the principles of the invention by changing the tapered sections 12 and 20 so that they have a stair step structure as shown in FIG. 2. The structure of FIG. 2 comprises a thin rectangular dielectric substrate 28. The top surface of the substrate supports a conductive transition structure comprising a stepped portion 30 which becomes narrower in steps from the left hand side of FIG. 2 toward the middle of FIG. 2. The stepped portion 30 comprises a stepped edge composed of tread sections 32, 34, and 36 and riser sections 38 and 40 and a curved edge 42 that define the narrowing of the stepped portion 30 from left to right in FIG. 2. The narrow end of the stepped portion 30 is connected to a micro-strip line 44 on the top side of the substrate that can be connected to the input or output of an RF power amplifier as shown in FIG. 4.

The bottom side of the substrate 28 supports a conductive stepped portion 46, shown in phantom in FIG. 2, that is symmetrical with respect to the stepped portion 30 on the top surface of the substrate 28. Like the stepped portion 30, the stepped portion 46 has a stepped edge composed of tread portions 48, 50, and 52 and riser portions 54 and 56. The stepped portion 46 also has a curved edge 58 like curved edge 42 of stepped portion 30. The narrow end of the stepped portion 46 is connected to a ground plane 60 underneath the micro-strip line 44. The stepped portions 30 and 46 form a stepped impedance transition that may be connected to the input and/or output of a high frequency power amplifier and will function as respective input and/or output antennas for the power amplifier.

Figure 3:
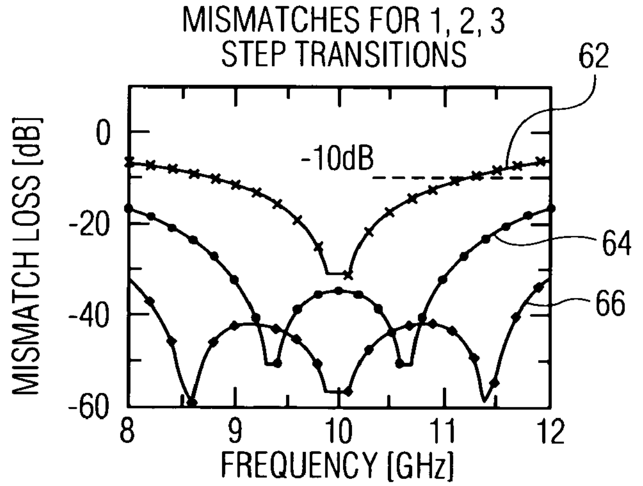
FIG. 3 is a graphical representation of the performance of the FIG. 2 structure as a function of the number of steps in the impedance step transition.

As shown in FIG. 2, the size of the transition structure can be made much smaller than the structure shown in FIG. 1. The width of each tread portion is shown to be one quarter wavelength. In a three step structure such as the one shown in FIG. 2, the width can thus be less than a fourth of the width of the FIG. 1 structure. The number of steps and the height and width of each step is determined by the desired performance requirements of the power amplification apparatus with which the transition structure is to be used. FIG. 3 illustrates the effect of varying the number of steps in the stepped portions 30 and 46 in FIG. 2. FIG. 3 is a plot of mismatch loss as a function of frequency for a one step structure, a two step structure, and a three step structure. Curve 62 is for the one step structure, curve 64 is for a two step structure, and curve 66 is for a three step structure. FIG. 3 demonstrates that, as the number of steps increases, the magnitude of the mismatch loss decreases and the breadth of the frequency range over which the device possesses good performance increases.

The substrate may be made of any dielectric material of appropriate thickness that allows a desired frequency of operation, such as gallium arsenide, alumina, or silicon. The conductive layers on the top and bottom sides of the substrate 30 may be made of any suitable conductive material, such as gold, copper, or aluminum. The conductive layers may be sized to provide an appropriate current handling capacity and frequency of operation. They may be formed on the substrate 28 by electroplating or evaporation, followed by photolithographic patterning techniques to achieve a desired shape.

FIG. 4 illustrates a power amplification module comprising transition structures shown in FIG. 2 connected to the input and output of an RF power amplifier on a single dielectric substrate. FIG. 4 also shows a power combining arrangement comprising an illustrative array of two parallel oriented power amplification modules 68 and 70 mounted side by side in an electromagnetic energy field.

Module 68 is a thin rectangular dielectric substrate 72. Conductive layers formed on the top surface of the dielectric substrate 72 include an input side stepped portion 74 and a micro-strip line 76 connected to the input of an RF power amplifier 78 that may be mounted on the substrate 72 or integrated into the substrate 72. The output of the amplifier 78 is connected to another micro-strip line 80 and an output side stepped portion 82. The bottom side of the substrate 72 includes a conductive layer composed of an input side stepped portion 84 and an output side stepped portion 86 connected to a shared ground plane 88.

The module 68 is located in an electromagnetic energy field either in free space or, alternatively, in or near a waveguide that carries an electromagnetic energy field. The input side stepped portions 74 and 84, the micro-strip line 76, and the ground plane 88 function as an input antenna that couples electromagnetic energy to the input of the power amplifier 78. The amplifier 78 amplifies the signal at its input and sends the amplified signal to the micro-strip line 80, ground plane 88, and output side stepped portions 82 and 86. The micro-strip line 80, ground plane 88, and output side stepped portions 82 and 86 act as an output antenna that radiates amplified electromagnetic energy out of the module 68.

Power amplifier module 68 may be used alone to amplify electromagnetic energy or it may be used in combination with one or more other such power amplifier modules in any one, two, or three dimensional array to achieve power combining operation. FIG. 4 shows an illustrative example of a two module power combining array in which the module 72 is located near another power amplifier module 70. Module 70 may be generally identical to the module 72 and functions in the same manner. Not all of the elements of the power combining module 70 are shown in FIG. 4, only the dielectric substrate 90, input side stepped portion 92, RF power amplifier 94, and output side stepped portion 96.

In any array of closely spaced modules like the ones described here, each module tends to radiate electromagnetic energy that can be picked up by one or more other modules in the array. This phenomenon results in unwanted cross talk between the modules and in some cases can cause a positive feedback situation that can render the amplifiers unstable. These problems are particularly acute when the array is located in a metallic enclosure such as a waveguide. Cross talk and instability can be reduced or eliminated by connecting one or more appropriately sized isolation impedances between the modules. These impedances couple energy that is the inverse of some or all of the energy that can flow between the modules so as to cancel out and/or dissipate the energy that produces the cross talk and instability. Preferably, the isolation impedance is a resistance or has a substantial resistive component. Isolation impedances may be used advantageously in arrays of amplifier modules using tapered slot line transitions and/or impedance step transitions.

Figure 5:
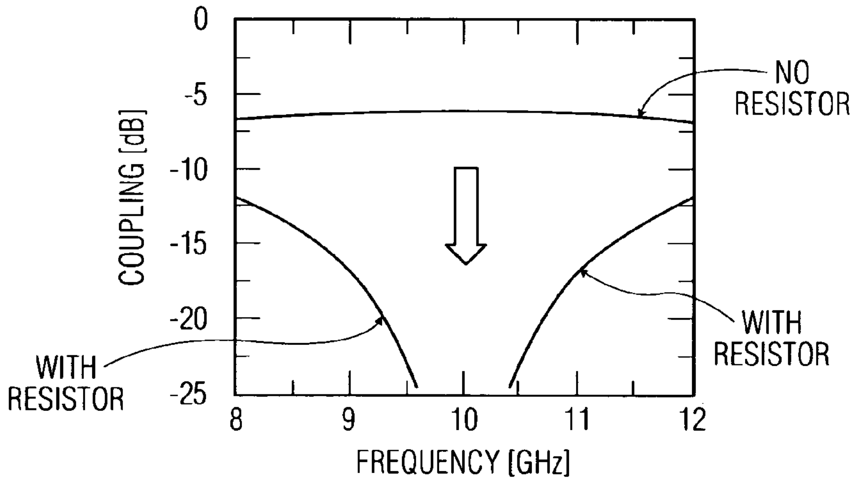
FIG. 5 is a graphical illustration of the performance of the structure of FIG. 4 both with and without isolation resistors.

Preferably, an isolation resistor 98 connects the input side stepped portion of module 68 with the input side stepped portion 92 of module 70. Another isolation resistor 100 connects the output side stepped portion 82 of module 68 with the output side stepped portion 96 of module 70. Use of resistors 98 and 100 increases the isolation between the power amplifier modules 68 and 70 and enhances the stability of the modules 68 and 70. FIG. 5 shows the coupling between the modules 68 and 70 and makes plain that the coupling between the modules 68 and 70 goes down dramatically with the use of the isolation resistors 98 and 100.

Figure 6:
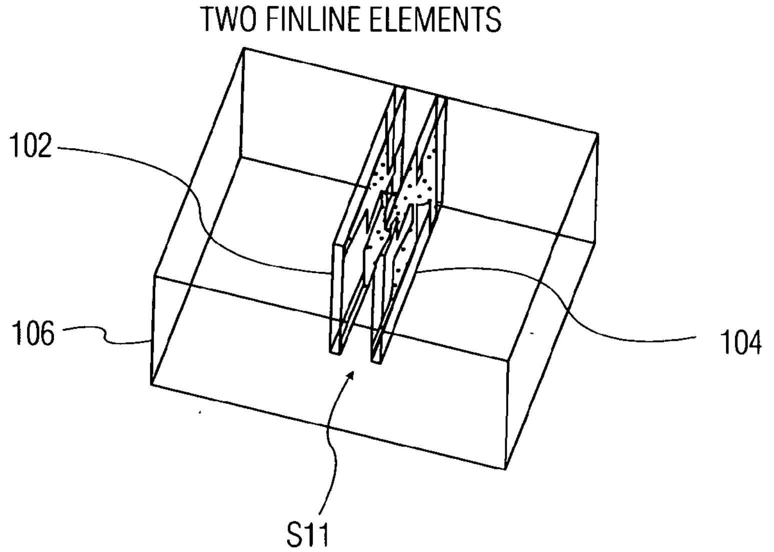
FIG. 6 is a depiction of power combining array located in a rectangular waveguide.
Figure 7:
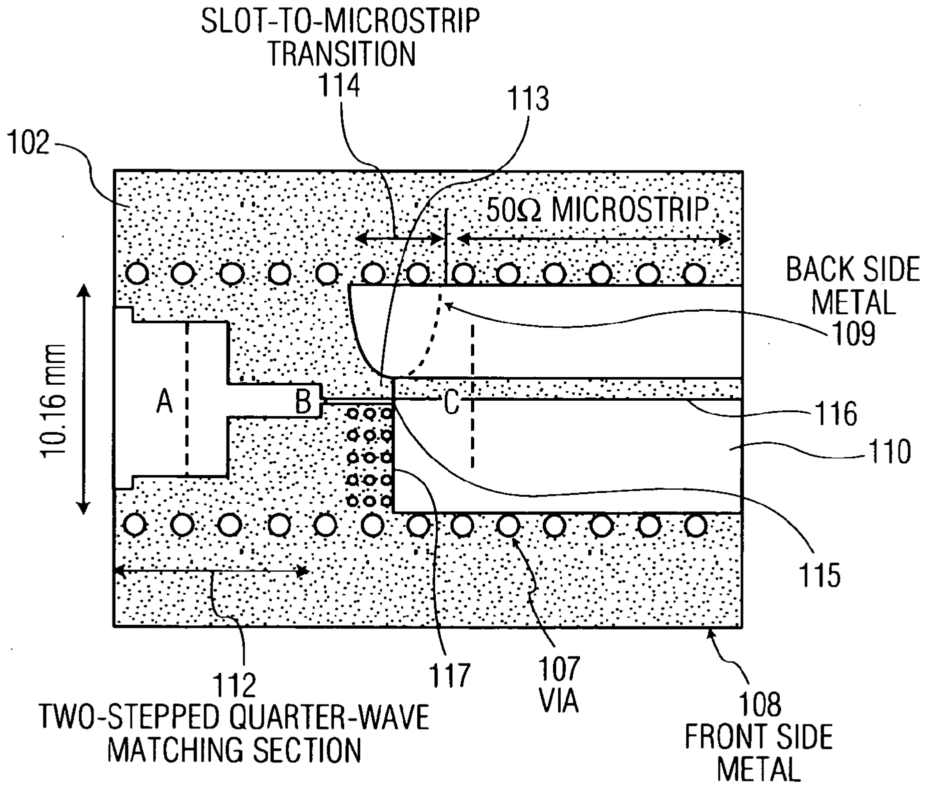
FIG. 7 is a front view of part of one of the power amplifier modules shown in FIG. 6.
Figure 8:
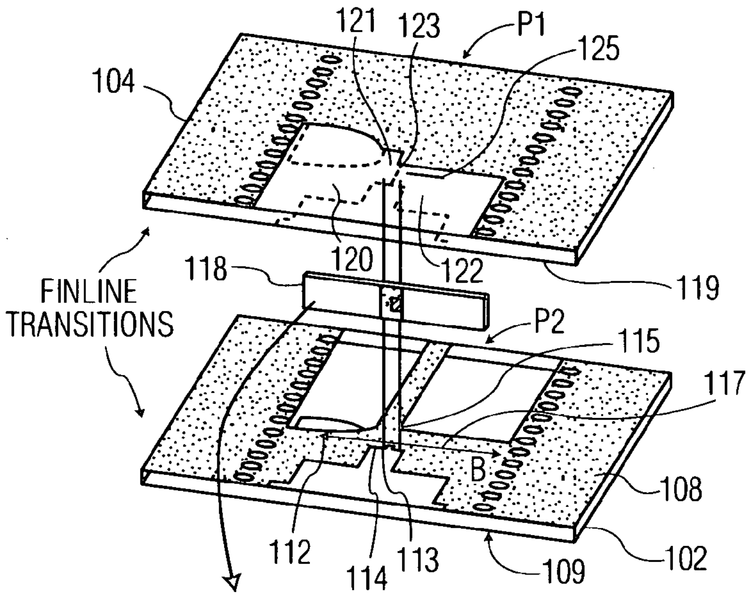
FIG. 8 is an exploded view of part of the power combining array shown in FIG. 6.
Figure 9:
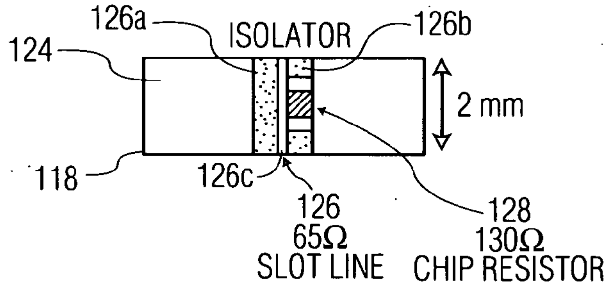
FIG. 9 shows the details of the isolation impedance shown in FIG. 8.

FIG. 6-9 show another example of the invention comprising two finline element power amplifier modules 102 and 104 parallel to one another in a rectangular metallic waveguide 106, made, for example, of aluminum. The front side of part of one of the modules 102 is shown in FIG. 7. The other module 104 is identical in this embodiment of the invention. FIG. 8 shows more details of how the modules 102 and 104 are oriented with respect to each other in the waveguide 106 and with respect to an isolation impedance connecting the modules 102 and 104. FIG. 9 shows the details of an isolation impedance between the modules 102 and 104. In FIGS. 6-9, only the stepped antenna structures on one side of the power amplifier modules 102 and 104 are shown.

Similar to the embodiments of the invention described above, module 102 comprises a dielectric substrate 110 having patterned metallization layers on both sides of the substrate 110. The structure of FIG. 7 comprises a front side metal layer 108 formed on one side of the dielectric substrate 110 and a back side metal layer 109 on the other side of the substrate 110. Vias 107 electrically connect the front and back side metal layers 108 and 109 through the substrate 110. The metal layer 108 comprises a two step quarter wave matching section 112 connected to a slot to micro-strip transition region 114 and a micro-strip 116. Regions 113 and 117 in the layer 108 are separated by a narrow gap 115. The micro-strip 116 may be connected to the input of a power amplifier not shown in FIGS. 6-9. Similar to the embodiment of the invention shown in FIG. 4, the output of that amplifier may be connected to an output antenna structure that is the mirror image of the input antenna structure shown in FIGS. 6-9.

The module 102 of FIG. 7 may be used in combination with same or similar modules, such as module 104 shown in FIGS. 6 and 8. As shown in FIGS. 6 and 8, module 102 is mounted parallel with module 104 inside the waveguide 106. The front side of module 102 faces the front side of module 104. To reduce cross talk and instability, an isolation impedance 118 connects the front side metal layer 108 of the module 102 to the front side metal layer 119 of the module 104. In this example of the invention, the isolation impedance 118 is connected to layer 108 near the boundary between matching section 112 and transition region 114 of module 102. The isolation impedance 118 is also connected to layer 119 on the front side of module 104 near the boundary between matching section 120 and transition region 122 of module 104.

As shown in FIGS. 8 and 9, the isolation impedance 118 comprises a thin rectangular substrate 124, made, for example, of alumina, that is mounted between and perpendicular to the modules 102 and 104 in FIG. 8. A slot line 126 is formed on the substrate 124 comprising two strips of conductive material 126*a* and 126*b* separated by a gap 126*c*. Strip 126*a* electrically connects region 113 of module 102 to a corresponding region 121 on one side of a gap 123 in layer 119 on the front side of module 104. Strip 126*b* electrically connects region 117 of module 102 with a corresponding region 125 on the other side of gap 123 in layer 119. A chip resistor 128 is soldered to strip 126*b* on the substrate 124.

Figure 10:
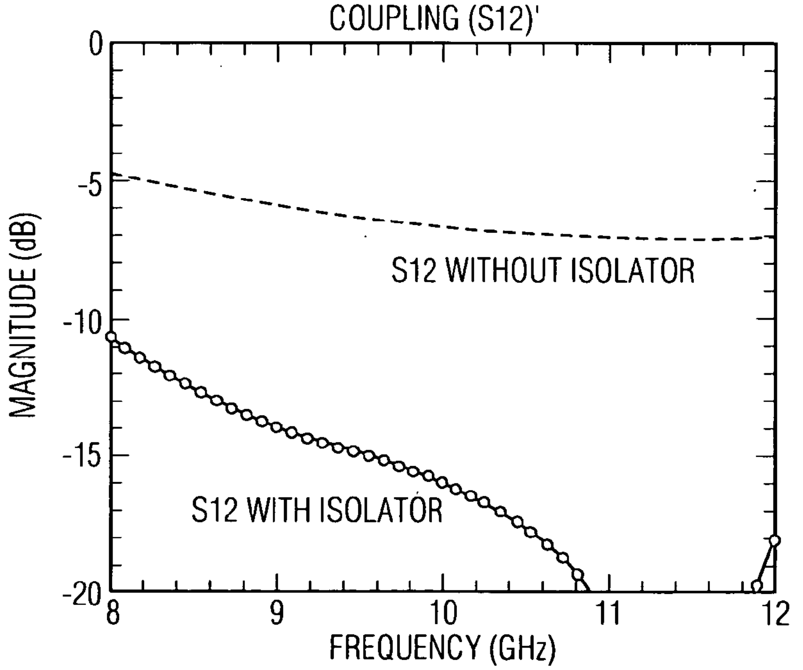
FIG. 10 is a graph illustrating the performance of power combining arrays having isolation impedances.

The isolation impedance 118 reduces cross talk between the modules 102 and 104. It also reduces instability in the amplifiers used with modules 102 and 104. See FIG. 10 which shows that there is a substantial reduction in energy transfer between ports P1 and P2 in the array of FIGS. 6 and 8 when an isolation impedance is used.

Power amplifier modules and arrays in accordance with this invention are smaller than power amplifier modules of the prior art. They are more stable, capable of higher power over a wider bandwidth, and less costly to produce.

The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited in the claims set forth below.

The invention claimed is:

1. A high frequency power combining array, comprising:

an array of power amplifier modules to be located in an electromagnetic energy field;

each of said power amplifier modules comprising an input antenna on a dielectric substrate defining a stepped impedance transition to an input of a power amplifier and an output antenna on the dielectric substrate defining a stepped impedance transition from an output of the power amplifier; and one or more resistive isolation impedances connecting selected power amplifier modules, the one or more resistive isolation impedances adapted to reduce instability and cross talk between the selected power amplifier modules by coupling energy to the selected power amplifier modules that is the inverse of at least a portion of the energy that can flow between the selected power amplifier modules so as to cancel out and/or dissipate energy that produces the instability and cross talk.

2. A high frequency power combining array, comprising:

an array of power amplifier modules adapted to be located in an electromagnetic energy field;

each of said power amplifier modules comprising a card adapted to perform as a dielectric substrate supporting a high frequency power amplifier, each card coated with one or more photolithographically patterned first conductive layers adapted to perform as an input antenna in the form of an impedance transition connected to an input of the power amplifier and each card also coated with one or more photolithographically patterned second conductive layers adapted to perform as an output antenna in the form of an impedance transition connected to an output of the power amplifier; and one or more resistive isolation impedances connecting selected ones of said power amplifier modules, the one or more resistive isolation impedances adapted to reduce instability and cross talk between the selected power amplifier modules by coupling energy to the selected power amplifier modules that is the inverse of at least a portion of the energy that can flow between the selected power amplifier modules so as to cancel out and/or dissipate energy that produces the instability and cross talk.

3. The power combiner of claim 2, in which one or more cards comprise a semiconductive substrate and the power amplifier is a high frequency amplifier integrated into the semiconductive substrate.

4. The power combiner of claim 3, in which the high frequency amplifier is a monolithic integrated circuit.

5. The power combiner of claim 2, in which the cards comprising the power amplifier modules are finline elements each having first and second sides, one or both of the first and second sides being coated with one or more photolithographically patterned conductive layers, the cards being arranged in a side by side orientation substantially parallel to one another;

the one or more resistive isolation impedances connecting one of the photolithographically patterned conductive layers on one of the sides of one of the cards to one of the photolithographically patterned conductive layers on one of the sides of another of the cards.

6. The power combiner of claim 5, in which the one or more isolation impedances each comprise:

a thin rectangular dielectric substrate mounted between and substantially perpendicular to the cards of two of the power amplifier modules;

a resistor situated on the thin rectangular substrate; and conductive material on the thin rectangular substrate connecting the resistor between conductive layers of the cards in two of the power amplifier modules.

* * * * *